US008605499B2

(12) United States Patent
Chang et al.

(10) Patent No.: US 8,605,499 B2
(45) Date of Patent: Dec. 10, 2013

(54) RESONANCE NANOELECTROMECHANICAL SYSTEMS

(75) Inventors: Leland Chang, New York, NY (US);
Michael A. Guillorn, Yorktown Heights, NY (US); Dechao Guo, Fishkill, NY (US); Fei Liu, Yorktown Heights, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 13/092,247

(22) Filed: Apr. 22, 2011

(65) Prior Publication Data

US 2012/0268985 A1    Oct. 25, 2012

(51) Int. Cl.
*G11C 11/50* (2006.01)
(52) U.S. Cl.
USPC ............................ 365/164; 365/149; 365/226
(58) Field of Classification Search
USPC ......................................... 365/164, 149, 226
See application file for complete search history.

(56) References Cited

U.S. PATENT DOCUMENTS

| | | | | |
|---|---|---|---|---|
| 6,509,605 | B1 | 1/2003 | Smith | 257/316 |
| 6,946,693 | B1 * | 9/2005 | Scheible et al. | 257/213 |
| 7,294,877 | B2 * | 11/2007 | Rueckes et al. | 257/296 |
| 7,362,605 | B2 | 4/2008 | Pinkerton et al. | 365/151 |
| 7,486,539 | B2 | 2/2009 | Jang et al. | 365/149 |
| 7,719,068 | B2 | 5/2010 | Lee et al. | 257/415 |
| 7,719,318 | B1 | 5/2010 | Nordquist et al. | 326/104 |
| 7,888,721 | B2 * | 2/2011 | Forbes | 257/301 |
| 8,115,344 | B2 * | 2/2012 | Feng et al. | 307/112 |
| 2008/0061351 | A1 | 3/2008 | Jang et al. | 257/315 |
| 2009/0129139 | A1 | 5/2009 | Kam et al. | 365/129 |
| 2009/0237980 | A1 | 9/2009 | Kim et al. | 365/149 |

OTHER PUBLICATIONS

J. E. Jang et al. "Nanoscale memory cell based on a nanoelectromechanical switched capacitor," Nature Nanotechnology, vol. 3, 2008, pp. 26-30, Published online: Dec. 23, 2007.
W. W. Jang et al., "Fabrication and characterization of a nanoelectromechanical switch with 15-nm-thick suspension air gap," Appl. Phys. Lett. vol. 92, 2008, 103110.
H. Noh et al., "A mechanical memory with a dc modulation of nonlinear resonance," Appl. Phys. Lett., vol. 97, 2010, 033116.
M.-S. Kim et al., "NEMS Switch with 30 nm Thick Beam and 20 nm High Air Gap for High Density Non-Volatile Memory Applications," 2007 International Semiconductor Device Research Symposium, Dec. 12-14, 2007, pp. 1-2.
W. W. Jang et al., "Mechanically Operated Random Access Memory (MORAM) Based on an Electrostatic Microswitch for Nonvolatile Memory Applications," IEEE Transactions on Electron Devices, vol. 55, No. 10, Oct. 2008, pp. 2785-2789.
J. E. Jang et al., "Nanoelectromechanical DRAM for ultra-large-scale integration (ULSI)," IEEE International Electron Devices Meeting, 2005, pp. 261-264.

\* cited by examiner

*Primary Examiner* — Son Dinh
*Assistant Examiner* — Nam Nguyen
(74) *Attorney, Agent, or Firm* — Ido Tuchman; Vazken Alexanian (57) ABSTRACT

Systems and methods for operating a nanometer-scale cantilever beam with a gate electrode. An example system includes a drive circuit coupled to the gate electrode where a drive signal from the circuit may cause the beam to oscillate at or near the beam's resonance frequency. The drive signal includes an AC component, and may include a DC component as well. An alternative example system includes a nanometer-scale cantilever beam, where the beam oscillates to contact a plurality of drain regions.

14 Claims, 6 Drawing Sheets

RESONANCE NANOELECTROMECHANICAL SYSTEMS

BACKGROUND

This invention relates to nanoelectromechanical systems (NEMS). More particularly, the present invention relates to a method for operating a NEMS device at or near its resonance frequency, a system that operates a NEMS device at or near its resonance frequency, and a system for operating a nanometer-scale cantilever with multiple drain regions.

Many memory cell devices use transistors to read and write data, but NEMS devices offer an alternative approach to performing this task. For example, because a NEMS switch is a mechanical switch, a NEMS-based memory cell can be in an OFF state without an existing off current. This is a valuable advantage over competing complimentary metal-oxide semiconductor (CMOS) technology. Because no off current, a NEMS switch may allow for a lower standby leakage current. NEMS switches may have better sub-threshold behavior than transistors, which are typically limited to 60 mV/dec. Using a NEMS switch may also provide for a sharper transition between 'off' and 'on' states than may occur in a CMOS transistor.

Despite some possible advantages, there exist several problems for implementing NEMS technology. First, NEMS devices may require a large control gate voltage (also referred to as "gate voltage") to operate, which may be in the order of 10 or 15 Volts. Second, NEMS devices may not be as reliable as their CMOS counterparts.

BRIEF SUMMARY

Accordingly, one aspect of the present invention is to provide for a cantilever beam proximate a gate electrode that operates at or near the beam's resonance frequency. Another aspect of the present invention is to provide for a method of operating a cantilever beam proximate a gate electrode at or near the beam's resonance frequency. Another aspect of the present invention is to provide for a cantilever beam proximate a gate electrode that contacts multiple drains during operation.

An example embodiment of the present invention is a NEMS switch involving a nanometer-scale cantilever beam anchored to a fixed end, while the beam's free end is proximate a gate electrode and a drain electrode. A drive circuit sends an AC modulated drive signal through the gate electrode, creating a gate voltage, which results in a pull-down force on the cantilever beam, thereby bringing the beam into contact with the drain electrode. By operating the AC modulated drive signal at or near the beam's resonance frequency, the beam may achieve a steady-state motion, whereby the beam oscillates at or near its resonance frequency. This beam's amplitude of motion may be larger than where the beam moved at other frequencies. A larger amplitude of motion may provide that less gate voltage may be necessary to operate the NEMS switch.

Implementations may include one or more of the following features. For example, a data storage unit connected to the drain electrode, such as a capacitor where the NEMS switch's ON state may charge the capacitor. Also, the beam's fixed end may connect to a source electrode where conductive material on the cantilever beam allows current to pass through the cantilever beam into the drain electrode to charge the data storage unit. Also, the drive signal may include a DC signal in addition to the AC modulated signal.

Another example embodiment of the present invention is a NEMS switch involving a nanometer-scale cantilever beam anchored to a fixed end, where the beam's free end is proximate a gate electrode and a plurality of drain regions. Where a drive circuit applies a voltage to the gate electrode, the cantilever beam may contact different drain surface regions while oscillating. Allowing contact with a plurality of drain regions may enable faster refresh rates by utilizing the beam's away motion to contact a drain region as well as the beam's returning motion to contact a drain region.

Implementations may include one or more of the following features. For example, the drain regions may be distinct components or monolithic. Also, the cantilever beam may be situated between two drain regions or in conjunction with other drain configurations. For example, a c-shaped drain electrode is another possible drain configuration.

Yet a further example embodiment of the invention is a method for applying a drive signal to a gate electrode proximate a cantilever beam where the drive signal includes an AC component at or near the beam's resonance frequency. The drive signal creates a voltage on the gate electrode, causing the cantilever beam to oscillate and contact a drain electrode.

Implementations of the embodiment may include a DC signal in addition to the AC signal in the drive signal, a drive signal with an amplitude less than 1 V, or where the beam contacts a plurality of drain regions during the beam's oscillation. In addition, the embodied method may charge a capacitor for a memory cell, such as for DRAM or eDRAM, or another data storage device.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to various embodiments of the invention. Throughout the description of the invention reference is made to FIGS. 1-6.

Figure 1:
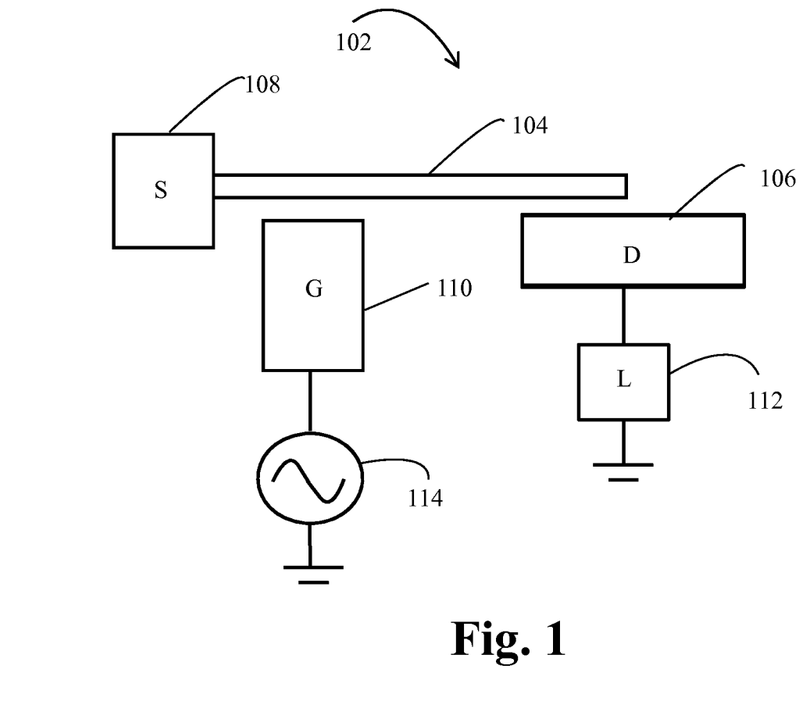
FIG. 1 is a schematic diagram of a nanoelectromechanical system showing one embodiment of the present invention.

FIG. 1 is a schematic drawing of a nanoelectromechanical system (NEMS) 102 showing one embodiment of the present invention. The system 102 includes a gate electrode 110, which is proximate a nanometer-scale cantilever beam 104, where the cantilever beam 104 has a resonance frequency, where the resonance frequency and resonant frequency are interchangeable terms. A drive circuit 114 is coupled to the gate electrode 110, and the drive circuit 114 is configured to apply a drive signal to the gate electrode 110.

Furthermore, this inventive embodiment in FIG. 1 may include a cantilever beam 104 with a fixed end and a free end. At the fixed end, the cantilever beam 104 may couple to a source electrode 108. Proximate the free end, the NEMS 102 may comprise a drain electrode 106, such that the cantilever beam 104 comes in contact with the drain electrode 106 when oscillating at the beam's 104 resonance frequency. A voltage at the gate electrode 110 may exert a pulling force on the cantilever beam 104 causing the beam to move towards the drain electrode 106.

At the resonance frequency, the cantilever beam 104 may oscillate at a larger amplitude than the beam 104 may operate at other frequencies. At the resonance frequency, the amplitude of the beam's 104 movement is Q times larger, where Q corresponds to the Q factor of the cantilever beam 104. Where the gate electrode 110 receives a pull-down voltage consisting of only an AC component, the AC voltage may be 1/Q of the required DC voltage. For example, if a NEMS switch has a Q of 10, where the original required DC voltage necessary for pulling down the beam 104 was 10 Volts, only an AC voltage of 1 V would be needed at the resonance frequency. Therefore, this inventive embodiment may allow for a smaller control gate voltage to pull the cantilever beam 104 into contact with the drain electrode 106. The cantilever beam may be able to contact the drain electrode through a control gate voltage less than 1 V.

A cantilever beam's resonance frequency is the result of the beam's material properties as well as structural dimensions. In regard to material properties, different materials result in different resonance frequencies. The cantilever beam may be made from polysilicon, tungsten, copper, and silicon nitride among other possible materials that may compose the beam. In regard to the cantilever's structure, a beam's length, thickness, and other characteristics that affect the beam's geometry may influence the actual resonance frequency. The resonance frequency may be in the order of GHz, which may be beneficial for use in memory cells by allowing for read and write times in nanoseconds.

Several possible processes may be used to fabricate a NEMS cell structure. One method for creating a NEMS device is to use FinFET architecture. To implement a FinFET architecture, reactive ion etching (RIE)or silicon on insulator (SOI) surface micromachining technology may be used to form the components of the NEMS switch, such as the cantilever and electrodes. Under SOI microfabrication, the NEMS device has an insulating layer, for example silicon dioxide, which is often referred to as "buried oxide" (BOX). The insulating layer is released to form a free moving cantilever. Alternatively, another process for creating a NEMS device is to fabricate the device at a back-end-of-line (BEOL) level. In the BEOL process, the source, gate, and drain electrodes are fabricated at the same or different BEOL levels, where an anchor is fabricated to the source electrode. Then, a cantilever is fabricated to the source and released.

A reduced gate voltage may provide several benefits of its own. By applying a smaller voltage to the gate electrode 110, the stiffness of the cantilever beam may be reduced, because the beam's restoring force may be able to overcome static friction, also referred to as stiction, allowing the tip to pull away from a contact surface. Another possible advantage may be a reduction in switch hysteresis occurring in a NEMS device.

Keeping with the embodiment in FIG. 1, the drain electrode 106 may couple to an electrical data storage unit 112, such as, for example, a capacitor for use in a DRAM memory cell, but other possible loads and storage devices are contemplated. In the case of a capacitor, the absence of a leakage current may lengthen the amount of time necessary for refreshing a memory cell. When a NEMS switch is in an ON state, the cantilever beam and the drain electrode may touch, and depending on the cantilever beam's amplitude, the contact between the drain electrode and the beam may be part of the system's duty cycle or the entire duty cycle. Where the gate has a DC voltage, the contact may be continuous, and the capacitor may charge during the entire duty cycle. Where the gate has an AC voltage, only the part of the duty cycle where the gate voltage can pull the cantilever beam into contact with the drain electrode will the capacitor charge. Still, where the gate voltage is turned to an OFF state, the NEMS device may continue operation until the cantilever beam's amplitude shrinks from contacting the drain electrode, due to the dampening effect caused by air.

Figure 2:
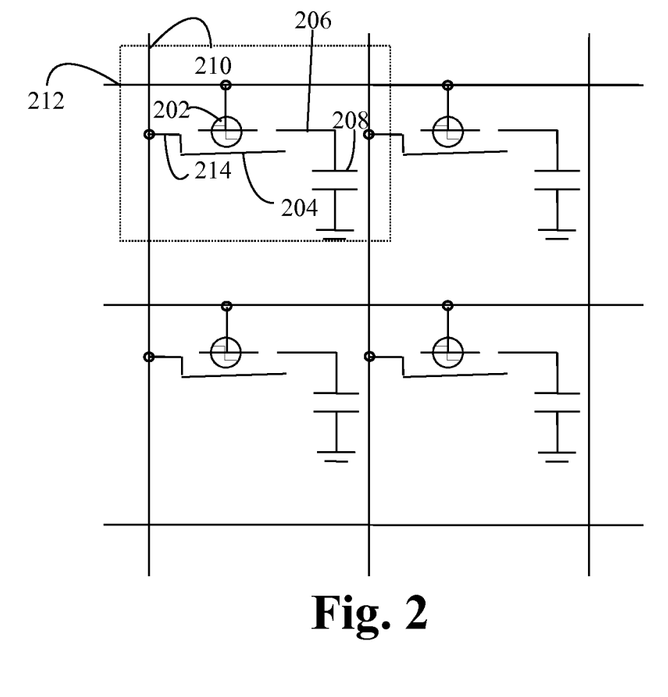
FIG. 2 is a schematic diagram showing a cluster of memory cells forming a DRAM unit and utilizing principles from the present invention.

FIG. 2 is a schematic diagram showing a cluster of NEMS-based memory cells forming a DRAM configuration 214 and utilizing principles from the present invention. Besides traditional DRAM, this embodiment may also work with embedded DRAM (eDRAM), as well as other possible memory types. A gate electrode 202 receives a signal from a word line 212. Upon the gate electrode 202 receiving a voltage, the gate 202 may exert a pull-down force on a cantilever beam 204 causing the beam 204 to contact the drain electrode 206. A source 214 may receive a signal from a bit line 210. The source 214 is connected to the cantilever beam 204, which may allow a current to run from the bit line 210 through the cantilever beam 204 into the drain electrode 206 and charge the capacitor 208. Because of this DRAM configuration 214, an AC voltage on the word line 212 may be applied in advance of a voltage on the bit line 210. Applying an AC voltage early to the word line 214 may allow the cantilever beam 204 to settle to steady state before a particular memory cell needs to be read or written to.

Figure 3:
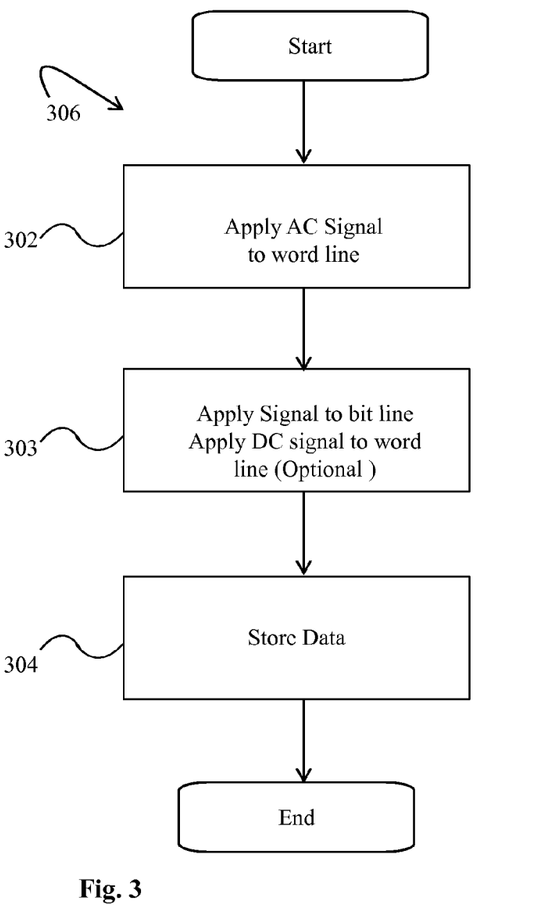
FIG. 3 is a flowchart for a method for operating a NEMS device, which may include a nanometer-scale cantilever beam that may have a resonance frequency in accordance with an embodiment of the present invention.

FIG. 3 is a flowchart for a method 306 for operating a NEMS device, which may include a nanometer-scale cantilever beam that may have a resonance frequency, in accordance with one embodiment of the present invention. The method 306 starts by applying operation 302. During this step, a gate electrode proximate the nanometer-scale cantilever beam receives a drive signal, also called the word line signal, where the drive signal includes an AC component at or near the resonance frequency. Furthermore, the drive signal in operation 302 may include a DC component in addition to an AC component. In regard to the AC component, the drive signal may operate at the cantilever beam's resonance frequency, or at a frequency within one standard deviation from a fabrication process variation of the resonance frequency. Also, the drive signal's amplitude may be less than 1 Volt.

Furthermore, the drive signal in operation 302 may correspond to a signal applied on the word line in a data storage or memory device. A DRAM cell is one of several examples of such memory devices, which utilize a word line configuration. Applying an AC word line with an amplitude below the voltage necessary for causing contact between the cantilever and the drain, may allow the NEMS cantilever to settle into a resonance motion without contacting the drain.

Keeping with the embodied method 306 in FIG. 3, an operation 303 may include the application of a bit line signal to a bit line in a data storage or memory device for selecting read or write capabilities. Where the cantilever beam is already moving at resonance, a DC voltage may be applied to the word line in conjunction to applying the bit line signal, causing the cantilever beam to contact the drain. Where the beam touches the drain, the bit line signal may pass from the source electrode to the drain electrode. Staggering application of the bit line signal and the AC word line signal from operation 302 may allow the NEMS device to become ready for operation with a relatively short setup time.

The embodied method 306 may also include a storing operation 304, where the NEMS device stores data. For example, the storing operation 304 may charge a capacitor for a DRAM memory cell, but the present invention contemplates other memory cell configurations as well.

During the storing operation 304, the NEMS device may oscillate to an ON position, where the nanometer-scale cantilever beam contacts a proximate drain electrode during the beam's oscillation. The drain electrode may comprise a single drain region or multiple drain regions, and the cantilever beam may contact only a single drain region or multiple different drain regions during the course of oscillation. An example of this particular storing operation 304 may be where the drain electrode includes an upper drain region, a lower drain region, and where the cantilever beam is situated between both drain regions. Still, other such embodiments of the drain electrode are contemplated.

Figure 4:
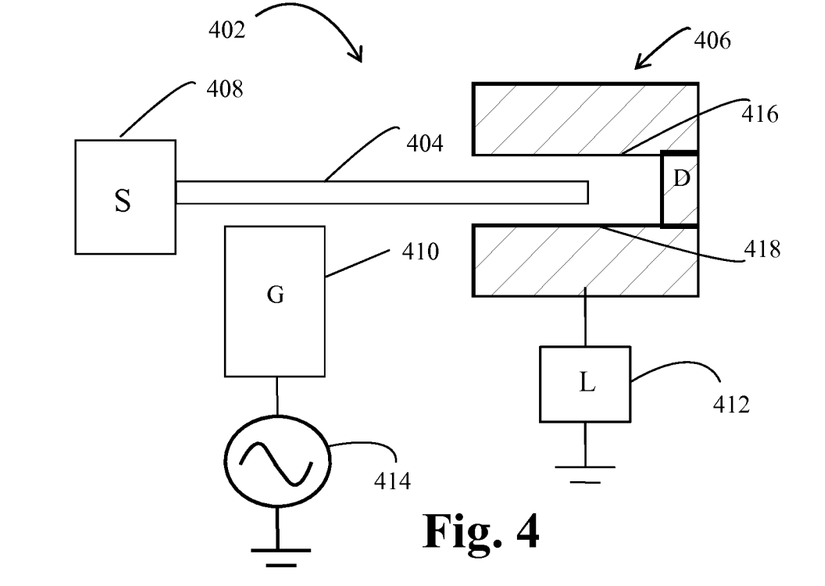
FIG. 4 is a schematic diagram for a nanoelectromechanical system embodying principles of the present invention.

FIG. 4 is a schematic diagram for another NEMS system 402 as contemplated by another embodiment of the present invention. This system 402 includes a gate electrode 410, which is proximate a nanometer-scale cantilever beam 404, and at least one drain electrode 406 comprising a first drain region 416 and a second drain region 418. As seen in FIG. 4, the first drain region 416 and the second drain region 418 may form one monolithic component, but other embodiments are envisioned where the drain electrode 406 comprises multiple distinct components. Furthermore, the first drain region 416 and the second drain region 418 of the drain electrode 406 may form a c-shaped configuration, but other possible configurations are contemplated.

During operation of the system 402, the cantilever beam 404 may contact more than one drain region. This beam 404 may oscillate at or near its resonance frequency. Where the nanoelectromechanical system 402 operates outside its resonance frequency, a frequency range within one standard deviation from the fabrication process variation of the resonance frequency may be used.

Figure 5:
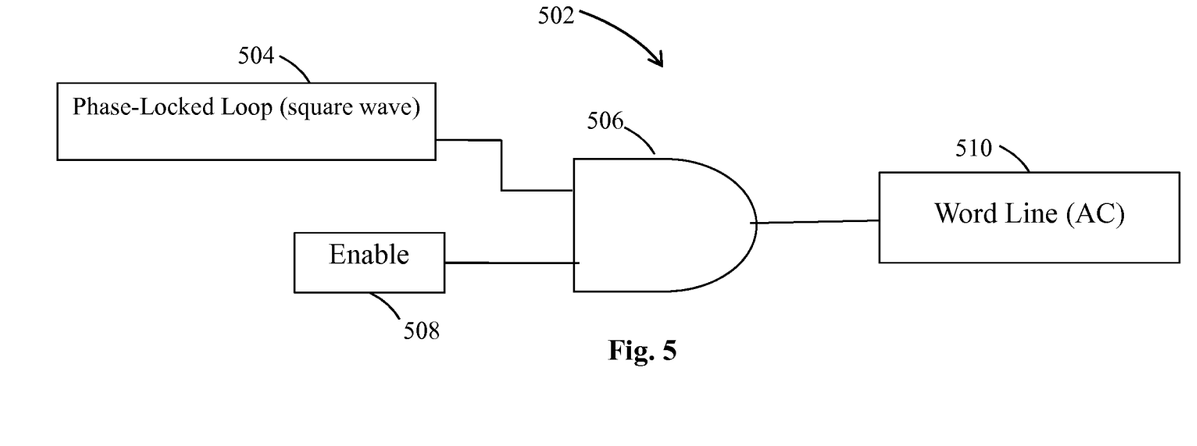
FIG. 5 is a schematic diagram showing a digital implementation of a drive circuit for operating one embodiment of the present invention.

FIG. 5 is a schematic diagram depicting an example embodiment 502 of a digital implementation of the nanoelectromechanical system's drive circuit 114 from FIG. 1. A drive signal 504, used in operating this embodiment 502, may have an amplitude less than 1 Volt, but other voltage amplitudes are contemplated. This drive signal's 504 operating frequency may be within one standard deviation from a fabrication process variation of the nanoelectromechanical system's resonance frequency.

In keeping with FIG. 5, a traditional phase locked loop (PLL) square wave may be used to generate an outputted word line signal 510, which can be gate-selected by an AND gate 506. An enable signal 508 may turn on the AND gate 502, as well as precede the activation of the inputted drive signal 504.

Figure 6:
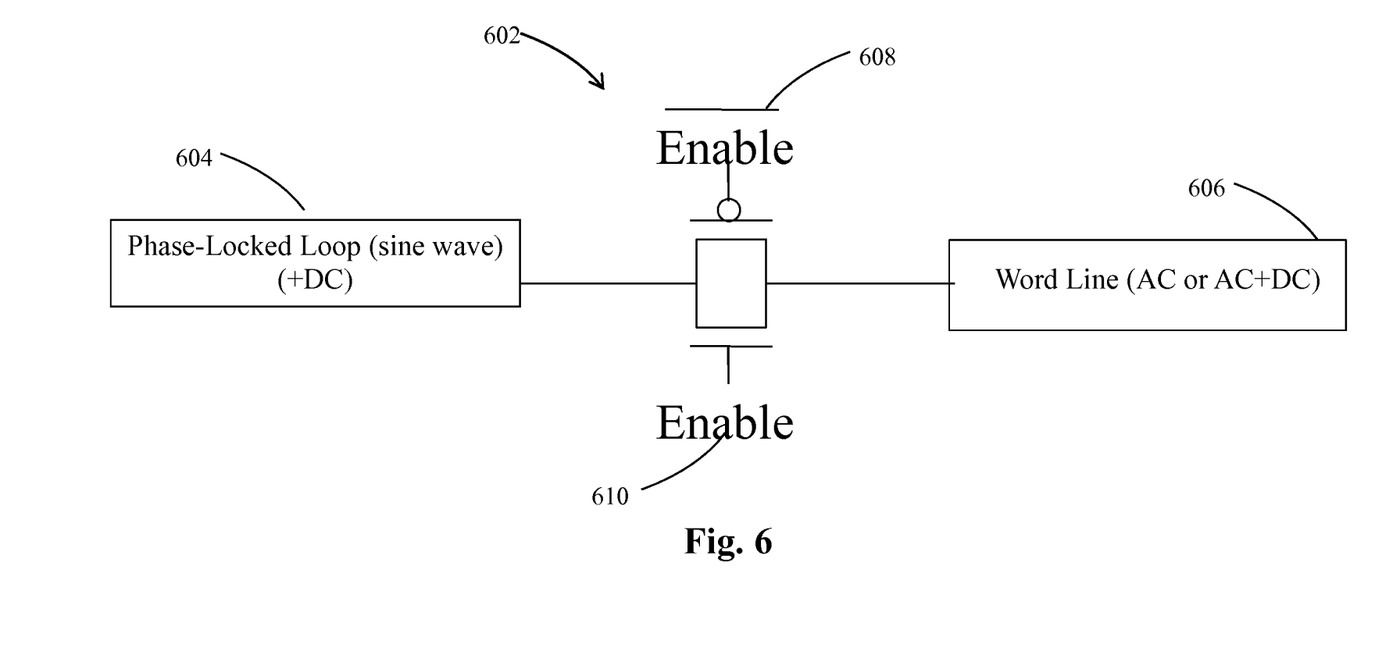
FIG. 6 is a schematic diagram showing an analog implementation of a drive circuit for operating one embodiment of the present invention.

FIG. 6 is a schematic diagram showing another example embodiment of the FIG. 1 drive circuit 114, but using an analog implementation 602 for operating the nanoelectromechanical system 102 and producing an output drive signal 606. An input drive signal 604, used in operating the drive circuit 602, may have an amplitude less than 1 Volt, but other voltages are contemplated as well. This inputted drive signal's 604 operating frequency may be within one standard deviation from a fabrication process variation of the nanoelectromechanical system's resonance frequency. The input drive signal 604 may include a DC component in addition to an AC component. For producing the drive signal 604, analog frequency generators can generate sine waves, which by many techniques known in the art may include DC offsets. For analog frequency generation, a pass-gate select implementation, as seen in the embodiment 602, may be required. An enable signal 610 may turn on the drive circuit embodiment 602, and may precede the activation of the inputted drive signal 604.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A nanoelectromechanical system (NEMS) comprising:
   a nanometer-scale cantilever beam having a resonance frequency, the cantilever beam includes a fixed end and free end;
   a source electrode coupled to the fixed end of the cantilever beam;
   a drain electrode proximate the free end;
   a gate electrode proximate the cantilever beam; and
   a drive circuit coupled to the gate electrode, the drive circuit configured to apply a drive signal to the gate electrode, the drive signal including an AC component substantially at the resonance frequency to oscillate the cantilever beam, and a DC component that positions the free end of the cantilever beam toward the drain electrode.

2. The nanoelectromechanical system of claim 1, wherein the drive signal has an amplitude less than 1 Volt.

3. The nanoelectromechanical system of claim 1, wherein the AC component's frequency is within one standard deviation from a fabrication process variation of the resonance frequency.

4. The nanoelectromechanical system of claim 1, further comprising:
   a bit line electrically coupled to the source electrode; and
   wherein the drive circuit is configured to apply the drive signal prior to activating the bit line.

5. The nanoelectromechanical system of claim 1, further comprising a capacitor electrically connected to the drain electrode.

6. A nanoelectromechanical system (NEMS) comprising:
   a plurality of drain regions, wherein the plurality of drain regions is c-shaped;
   a nanometer-scale cantilever beam positioned between the plurality of drain regions; and
   a gate electrode proximate the cantilever beam.

7. The nanoelectromechanical system of claim 6, wherein the plurality of drains regions are monolithic.

8. The system of claim 6, further comprising:
   a source electrode coupled to a fixed end of the cantilever beam;
   a drive circuit coupled to the gate electrode, the drive circuit configured to apply a drive signal to the gate electrode, the drive signal including an AC component substantially at a resonance frequency of the cantilever beam, and a DC component that positions a free end of the cantilever beam toward the drain regions.

9. The nanoelectromechanical system of claim 8, wherein the AC component's frequency is within one standard deviation from a fabrication process variation of the resonance frequency.

10. The nanoelectromechanical system of claim 6, further comprising:
   wherein the cantilever beam includes a fixed end and free end;
   a source electrode coupled to the fixed end; and
   a bit line electrically coupled to the source electrode;
   wherein the drive circuit is configured to apply the drive signal prior to activating the bit line.

11. A method for operating a nanoelectromechanical system, the nanoelectromechanical system including a nanometer-scale cantilever beam having a resonance frequency, the cantilever beam includes a fixed end and free end, the method comprising:
   applying an AC component of a drive signal to a gate electrode proximate the cantilever beam, the AC component at or near the resonance frequency; and
   applying a DC component of the drive signal to the gate electrode, the DC component positioning the free end of the cantilever beam toward with a drain electrode.

12. The method of claim 11, wherein the drive signal has an amplitude less than 1 Volt.

13. The method of claim 11, wherein the AC component operates at a frequency within one standard deviation from a fabrication process variation of the resonance frequency.

14. The method of claim 11, further comprising storing data in a memory cell.

* * * * *